US010304722B2

(12) United States Patent
Wang et al.

(10) Patent No.: US 10,304,722 B2
(45) Date of Patent: May 28, 2019

(54) METHOD OF MANUFACTURING SEMICONDUCTOR-ON-INSULATOR

(71) Applicants: SUNEDISON SEMICONDUCTOR LIMITED, Singapore (SG); Shawn G. Thomas, St. Peters, MO (US)

(72) Inventors: Gang Wang, Grover, MO (US); Shawn George Thomas, Chesterfield, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/574,054

(22) PCT Filed: May 23, 2016

(86) PCT No.: PCT/US2016/033780
§ 371 (c)(1),
(2) Date: Nov. 14, 2017

(87) PCT Pub. No.: WO2016/196060
PCT Pub. Date: Dec. 8, 2016

(65) Prior Publication Data
US 2018/0294182 A1  Oct. 11, 2018

Related U.S. Application Data (60) Provisional application No. 62/169,173, filed on Jun. 1, 2015.

(51) Int. Cl.
*H01L 21/762* (2006.01)
*H01L 21/02* (2006.01)
(Continued)

(52) U.S. Cl.
CPC .... *H01L 21/76254* (2013.01); *H01L 21/0245* (2013.01); *H01L 21/0262* (2013.01);
(Continued)

(58) Field of Classification Search
CPC ......... H01L 21/76254; H01L 21/02502; H01L 32/30604; H01L 21/02664; H01L 21/0262;
(Continued)

(56) References Cited

U.S. PATENT DOCUMENTS

| 4,501,060 A | 2/1985 | Frye et al. |
| 4,755,865 A | 7/1988 | Wilson et al. |

(Continued)

FOREIGN PATENT DOCUMENTS

| EP | 0939430 A2 | 1/1999 |
| EP | 0926709 A2 | 6/1999 |

(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.

(Continued)

*Primary Examiner* — William Coleman
(74) *Attorney, Agent, or Firm* — Armstrong Teasdale LLP (57) ABSTRACT

The disclosed method is suitable for producing a semiconductor-on-insulator structure, such as a Ge(Si)-on-insulator structure or a Ge-on-insulator structure. According to the method, a multilayer comprising alternating pairs of layers, comprising a layer of silicon and a layer of germanium optionally with silicon is deposited on a silicon substrate comprising a germanium buffer layer. The multilayer is completed with a silicon passivation layer. A cleave plane is formed within the multilayer, and the multilayer structure is bonded to a handle substrate comprising a dielectric layer. The multilayer structure is cleaved along the cleave plane to thereby prepare a semiconductor-on-insulator structure comprising a semiconductor handle substrate, a dielectric (Continued)

layer, a silicon passivation layer, and at least a portion of the alternating pairs of layers, comprising a layer of silicon and a layer of germanium optionally with silicon.

33 Claims, 6 Drawing Sheets

(51) Int. Cl.
*H01L 21/306* (2006.01)
*H01L 21/3065* (2006.01)
(52) U.S. Cl.
CPC .. *H01L 21/02381* (2013.01); *H01L 21/02502* (2013.01); *H01L 21/02507* (2013.01); *H01L 21/02532* (2013.01); *H01L 21/02664* (2013.01); *H01L 21/3065* (2013.01); *H01L 21/30604* (2013.01)
(58) Field of Classification Search
CPC ............ H01L 21/3065; H01L 21/0245; H01L 21/02532; H01L 21/02381; H01L 21/02507
See application file for complete search history.

(56) References Cited

U.S. PATENT DOCUMENTS

| | | | |
|---|---|---|---|
| 4,968,384 A | 11/1990 | Asano | |
| 5,189,500 A | 2/1993 | Kusunoki | |
| 6,043,138 A | 3/2000 | Ibok | |
| 6,373,113 B1 | 4/2002 | Gardner et al. | |
| 6,465,045 B1 | 10/2002 | Heuer et al. | |
| 6,562,127 B1 | 5/2003 | Kud et al. | |
| 6,624,047 B1 | 9/2003 | Sakaguchi et al. | |
| 6,893,936 B1 | 5/2005 | Chen et al. | |
| 7,084,460 B2* | 8/2006 | Chen ................. | H01L 21/76254 257/347 |
| 7,638,410 B2* | 12/2009 | Nastasi .............. | H01L 21/6835 257/E21.211 |
| 7,868,419 B1 | 1/2011 | Kerr et al. | |
| 7,879,699 B2 | 2/2011 | Schulze et al. | |
| 7,915,716 B2 | 3/2011 | Pisigan et al. | |
| 8,058,137 B1* | 11/2011 | Or-Bach ............ | H03K 17/687 257/E21.023 |
| 8,076,750 B1 | 12/2011 | Kerr et al. | |
| 8,466,036 B2 | 6/2013 | Brindle et al. | |
| 8,481,405 B2 | 7/2013 | Arriagada et al. | |
| 8,748,940 B1* | 6/2014 | Rachmady ........ | H01L 29/66742 257/190 |
| 8,796,116 B2 | 8/2014 | Grabbe et al. | |
| 8,846,493 B2 | 9/2014 | Libbert et al. | |
| 8,859,393 B2 | 10/2014 | Ries et al. | |
| 9,202,711 B2 | 12/2015 | Liu et al. | |
| 9,536,736 B2* | 1/2017 | Bedell .............. | H01L 21/02532 |
| 2002/0090758 A1 | 7/2002 | Henley et al. | |
| 2004/0005740 A1 | 1/2004 | Lochtefeld et al. | |
| 2004/0031979 A1 | 2/2004 | Lochtefeld et al. | |
| 2004/0108537 A1 | 6/2004 | Tiwari | |
| 2004/0137698 A1 | 7/2004 | Taraschi et al. | |
| 2005/0153524 A1 | 7/2005 | Maa et al. | |
| 2005/0167002 A1 | 8/2005 | Ghyselen et al. | |
| 2006/0030124 A1 | 2/2006 | Maa et al. | |
| 2006/0033110 A1 | 2/2006 | Alam et al. | |
| 2006/0226482 A1 | 10/2006 | Suvorov | |
| 2007/0032040 A1 | 2/2007 | Lederer | |
| 2007/0054466 A1 | 3/2007 | Hebras | |
| 2007/0117350 A1* | 5/2007 | Seacrist ............ | H01L 21/30604 438/459 |
| 2008/0153251 A1 | 6/2008 | Kostrzewa et al. | |
| 2008/0251814 A1* | 10/2008 | Lee ................... | H01L 21/76254 257/200 |
| 2009/0004833 A1 | 1/2009 | Suzuki et al. | |
| 2009/0014828 A1 | 1/2009 | Mizushima et al. | |
| 2009/0092810 A1 | 4/2009 | Lee et al. | |
| 2009/0179226 A1 | 7/2009 | Teo et al. | |
| 2009/0321829 A1 | 12/2009 | Nguyen et al. | |
| 2011/0174362 A1 | 7/2011 | Tanner et al. | |
| 2011/0298083 A1 | 12/2011 | Yoneda | |
| 2012/0091587 A1 | 4/2012 | Or-Bach et al. | |
| 2012/0161310 A1 | 6/2012 | Brindle et al. | |
| 2012/0238070 A1 | 9/2012 | Libbert et al. | |
| 2012/0267681 A1 | 10/2012 | Nemoto et al. | |
| 2013/0120951 A1 | 5/2013 | Zuo et al. | |
| 2013/0122672 A1 | 5/2013 | Or-Bach et al. | |
| 2013/0168835 A1 | 7/2013 | Botula et al. | |
| 2013/0193445 A1 | 8/2013 | Dennard et al. | |
| 2013/0196483 A1* | 8/2013 | Dennard ........... | H01L 21/76254 438/458 |
| 2013/0294038 A1 | 11/2013 | Landru et al. | |
| 2013/0344680 A1 | 12/2013 | Arriagada et al. | |
| 2014/0042598 A1 | 2/2014 | Kitada et al. | |
| 2014/0070215 A1 | 3/2014 | Bedell et al. | |
| 2014/0084290 A1 | 3/2014 | Allibert, II | |
| 2014/0120654 A1 | 5/2014 | Fujii et al. | |
| 2014/0124902 A1 | 5/2014 | Botula et al. | |
| 2014/0273405 A1 | 9/2014 | Liu et al. | |
| 2015/0004778 A1* | 1/2015 | Botula .............. | H01L 21/04 438/510 |
| 2015/0115480 A1 | 4/2015 | Peidous et al. | |
| 2018/0233400 A1* | 8/2018 | Wang ............... | H01L 21/02381 |

FOREIGN PATENT DOCUMENTS

| | | |
|---|---|---|
| EP | 1081748 A2 | 3/2001 |
| EP | 1865551 A1 | 12/2007 |
| EP | 2426701 A1 | 7/2012 |
| EP | 2503592 A1 | 9/2012 |
| JP | H01315144 A | 12/1989 |
| JP | 2012253364 A | 12/2012 |
| WO | 2009120407 A2 | 10/2009 |
| WO | 2012127006 A1 | 9/2012 |

OTHER PUBLICATIONS

Lederer, D. et al., Enhanced High resistivity SOI wafers for RF Applications, 2004, IEEE International SOI Conference, Oct. 2004, pp. 46-47.

Lederer, D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si Substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Jounral of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Allied Physics, Oct. 15, 1996 American Institute of Physics, pp. 4767-4769, vol. 70, No. 8.

Gao, Min, et al., Two-dimensional network of dislocations and nanocavities in hydrogen-implanted and two-step annealed silicon, Applied Physics Letters, American Institute of Physics, May 18, 1998, pp. 2544-2546, vol. 72, No. 20.

Taraschi, Gianni et al., Strained Si, SiGe, and Ge on-insulator: review of wafer bonding fabrication techniques, Solid State Electronics, Aug. 1, 2004, pp. 1297-1305, vol. 48, Elsevier Science Publishers.

(56) References Cited

OTHER PUBLICATIONS

Taraschi, Gianni et al., Relaxed SiGe on Insulator Fabricated Via Wafer Bonding an Layer Transfer: Etch-Back and Smart-Cut Alternatives, Electrochemical Society Proceedings vol. 2001-3, Mar. 25, 2001, pp. 27-32, vol. 2001-3.

International Search Report and Written Opinion of the International Searching Authority regarding PCT/US2016/033780 dated Aug. 30, 2016, pp. 1-14.

* cited by examiner

METHOD OF MANUFACTURING SEMICONDUCTOR-ON-INSULATOR

CROSS-REFERENCE TO RELATED APPLICATION

This application is a National Stage application of International Application No. PCT/US2016/033780, filed on May 23, 2016. International Application No. PCT/US2016/033780 claims priority to U.S. Provisional patent application Ser. No. 62/169,173 filed on Jun. 1, 2015. The disclosure of which is hereby incorporated by reference in its entirety.

THE FIELD OF THE INVENTION

The present invention generally relates to the field of semiconductor wafer manufacture. More specifically, the present invention relates to a method for forming a semiconductor-on-insulator structure, such as a Ge(Si)-on-insulator structure or a Ge-on-insulator structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and microcracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

Silicon germanium-on-insulator (SGOI) substrates are often manufactured either by germanium condensation or layer transfer of a silicon germanium layer from an epitaxially deposited silicon germanium buffer layer grown on a silicon substrate. In the Ge condensation approach, a strained SiGe epitaxial layer is grown on Si-on-insulator (SOI). See T Tezuka, et al., APL 79, p 1798 (2001). The Ge concentration of the SiGe epitaxial layer is usually in the range of between 10 and 30%. Following epitaxial deposition of a silicon germanium layer, the wafer is processed in a furnace with various thermal cycles in $O_2$ ambient atmosphere to preferentially oxidize silicon. Between the oxidation cycles, an anneal in an argon ambient atmosphere is often used to allow Ge diffusion and to homogenize the layer. The high densities of stacking faults generated by the dissociation of threading dislocations due to the strain relaxation of SiGe layer during Ge condensation is a disadvantage of this approach.

Alternatively, a thin SiGe layer is transferred from a strain relaxed SiGe buffer layer using smart-cut technique. See Fitzgerald, Solid-State Electronics 48 (2004) 1297-1305. The layer quality of the transferred SiGe layer is determined by the SiGe epitaxial layer grown on the donor substrate. Research to date has shown that it is very challenging to obtain high quality strain relaxed SiGe buffer layer. In order to take advantage of the higher carrier mobility in SiGe layer compared to a silicon layer, the Ge concentration in SiGe layer needs to be higher than 50%, preferably higher than 80%. The high density of threading dislocations ($\sim 10^{10}$ threading dislocations per $cm^2$) in strain relaxed SiGe buffers with high Ge concentration and the rough surface ($R_{ms}$ on the order of between 2 and 50 nm) caused by dense threading dislocations degrades the transferred SiGe layer quality and complicates the layer transfer process. In addition, the residual stress in the SiGe buffer layer leads to high wafer bow, especially for 300 mm wafers, which causes process issues in wafer bonding and layer transfer.

SUMMARY OF THE INVENTION

Briefly, the present invention is directed to a method of preparing a multilayer structure. The method comprises (a) depositing a first layer comprising germanium on a front surface of a silicon substrate, wherein the silicon substrate comprises two major, generally parallel surfaces, one of which is the front surface of the silicon substrate and the other of which is a back surface of the silicon substrate, a circumferential edge joining the front and back surfaces of the silicon substrate, a central plane between and parallel to the front surface and the back surface of the silicon substrate, a central axis perpendicular to the central plane, and a bulk region between the front and back surfaces of the silicon substrate, and further wherein the first layer comprising germanium has a thickness between about 0.5 micrometer and about 100 micrometers, as measured along the central axis; (b) depositing a second layer comprising silicon on the first layer comprising germanium, wherein the second layer comprising silicon has a thickness between about 0.5 nanometer and about 5 nanometers, as measured along the central axis; and (c) depositing a third layer comprising germanium and optionally silicon on the second layer comprising silicon, wherein the third layer comprising silicon and germanium has a formula $Si_xGe_{1-x}$, wherein x is between about 0 and about 0.8, molar ratio and further wherein the third layer comprising silicon and germanium has a thickness of at least about 1 nanometer.

The present invention is further directed to a method of preparing a semiconductor-on-insulator structure. The method comprises forming a cleave plane in a multilayer structure, the multilayer structure comprising (i) a silicon substrate comprising two major, generally parallel surfaces, one of which is a front surface of the silicon substrate and the other of which is a back surface of the silicon substrate, a circumferential edge joining the front and back surfaces of the silicon substrate, a central plane between and parallel to the front surface and the back surface of the silicon substrate, a central axis perpendicular to the central plane, and a bulk region between the front and back surfaces of the silicon substrate, (ii) a germanium layer in interfacial contact with the front surface of the silicon substrate, (iii) at least one pair of layers in interfacial contact with the germanium layer, each pair of layers comprising a silicon layer and a layer comprising germanium and optionally silicon having a formula $Si_xGe_{1-x}$, wherein x is between about 0 and about 0.8, molar ratio, and (iv) a silicon passivation layer in contact with the at least one pair of layers, wherein the cleave plane is formed within the at least one pair of layers comprising the silicon layer and the silicon germanium layer; and bonding the multilayer structure to a dielectric layer interfacial contact with a front surface of a semiconductor handle substrate, the semiconductor handle substrate comprising two major, generally parallel surfaces, one of which is the front surface of the semiconductor handle wafer and the other of which is a back surface of the semiconductor handle substrate, a circumferential edge joining the front and back surfaces of the semiconductor handle substrate, and a bulk region between the front and back surfaces of the semiconductor handle substrate.

The present invention is still further directed to a multilayer structure comprising: (i) a silicon substrate comprising two major, generally parallel surfaces, one of which is a front surface of the silicon substrate and the other of which is a back surface of the silicon substrate, a circumferential edge joining the front and back surfaces of the silicon substrate, a central plane between and parallel to the front surface and the back surface of the silicon substrate, a central axis perpendicular to the central plane, and a bulk region between the front and back surfaces of the silicon substrate, (ii) a germanium layer in interfacial contact with the front surface of the silicon substrate, (iii) at least one pair of layers in interfacial contact with the germanium layer, each pair of layers comprising a silicon layer and a layer comprising germanium and optionally silicon having a formula $Si_xGe_{1-x}$, wherein x is between about 0 and about 0.8, molar ratio, and (iv) a silicon passivation layer in contact with the at least one pair of layers.

Other objects and features of this invention will be in part apparent and in part pointed out hereinafter.

DETAILED DESCRIPTION OF THE EMBODIMENT(S) OF THE INVENTION

According to some embodiments of the present invention, a method is provided for producing a semiconductor-on-insulator structure (SOI), and more specifically a silicon germanium-on-insulator structure (SGOI). In some embodiments, a buffer layer comprising Ge is deposited on a silicon substrate, e.g., a silicon wafer, and more specifically a single crystal silicon wafer. The buffer layer enables subsequent deposition of one or more high-quality Ge or SiGe layers. Deposition of a Ge or SiGe layer is followed by deposition of a thin silicon layer. The process of depositing a Ge or SiGe layer, followed by deposition of a thin silicon layer may be repeated one or more times, e.g., two, three, four, five, six, seven, eight or more times, forming a multilayer stack of alternating Ge or SiGe and silicon layers. The high quality silicon germanium layers may be subjected to ion implantation and bonding to a handle substrate and subjected to a cleaving technique for manufacturing SGOI.

I. Substrates

Figure 1A:
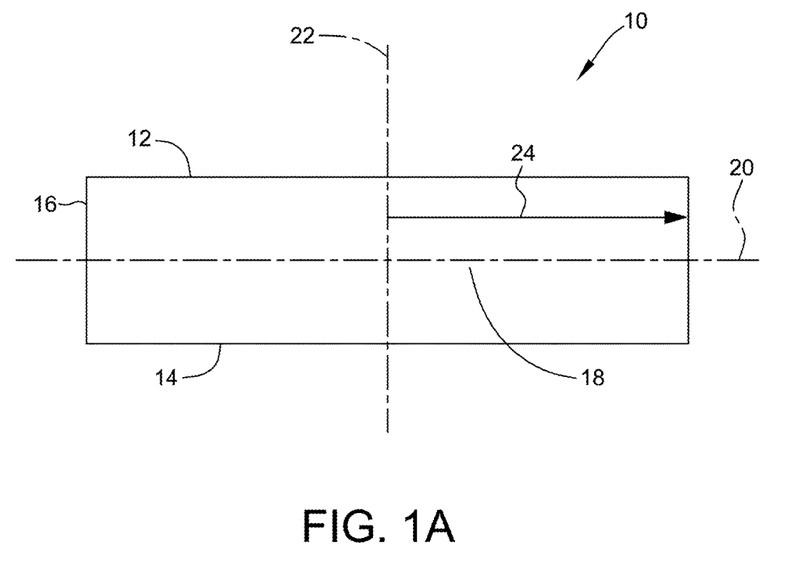
FIGS. 1A through 1E depict an exemplary process flow to manufacture a multilayer silicon germanium donor structure according to some embodiments of the method of the present invention.

With reference to FIG. 1A, a substrate for use in the method of the present invention may comprise a semiconductor substrate 10, such as a silicon substrate, e.g., a silicon wafer, and more specifically a single crystal silicon wafer. In general, the semiconductor substrate 10 comprises two major, generally parallel surfaces 12, 14. One of the parallel surfaces is a front surface 12 of the wafer, and the other parallel surface is a back surface 14 of the wafer. The semiconductor substrate 10 comprises a circumferential edge 16 joining the front surface 12 and back surface 14, a bulk region 18 between the front surface 12 and back surface 16, and a central plane 20 between the front and back surfaces. The semiconductor substrate 10 additionally comprises an imaginary central axis 22 perpendicular to the central plane 22 and a radial length 24 that extends from the central axis 22 to the circumferential edge 16. In addition, because semiconductor wafers, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation of the present invention, the front surface 12 and the back surface 14 of a semiconductor substrate 10 may be substantially identical. A surface is referred to as a "front surface" or a "back surface" merely for convenience and generally to distinguish the surface upon which the operations of method of the present invention are performed. In the context of the present invention, a "front surface" of a semiconductor substrate 10, e.g., a single crystal silicon wafer, refers to the major surface upon which the steps of the method of the present invention are performed.

The semiconductor substrate 10 may be a single crystal semiconductor wafer. In preferred embodiments, the semiconductor wafers comprise a semiconductor material selected from the group consisting of silicon, silicon carbide, sapphire, aluminum nitride, silicon germanium, gallium arsenide, gallium nitride, indium phosphide, indium gallium arsenide, germanium, and combinations thereof. The single crystal semiconductor wafers of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In particularly preferred embodiments, the semiconductor substrate 10 comprises a single crystal silicon wafer which has been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In some embodiments, the semiconductor substrate 10, e.g., the single crystal silicon wafer, comprises interstitial oxygen in concentrations that are generally achieved by the Czochralski-growth method. In some embodiments, the semiconductor wafers comprise oxygen in a concentration between about 4 PPMA and about 18 PPMA. In some embodiments, the semiconductor wafers comprise oxygen in a concentration between about 10 PPMA and about 35 PPMA. Preferably, the single crystal silicon wafer comprises oxygen in a concentration of no greater than about 10 ppma. Interstitial oxygen may be measured according to SEMI MF 1188-1105.

In general, there are no constraints on the resistivity of the handle wafers of the SOI substrate. The semiconductor substrate 10 may have any resistivity obtainable by the Czochralski or float zone methods. Accordingly, the resistivity of the semiconductor substrate 10 is based on the requirements of the end use/application of the structure of the present invention. The resistivity may therefore vary from milliohm or less to megaohm or more. In some embodiments, the semiconductor substrate 10 comprises a p-type or an n-type dopant. Suitable dopants include boron (p type), gallium (p type), phosphorus (n type), antimony (n type), and arsenic (n type). The dopant concentration is selected based on the desired resistivity of the handle wafer.

In some embodiments, the single crystal semiconductor handle substrate comprises a p-type dopant. In some embodiments, the single crystal semiconductor handle substrate is a single crystal silicon wafer comprising a p-type dopant, such as boron.

In some embodiments, the semiconductor substrate 10 has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the semiconductor substrate 10 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), phosphorus (n type), antimony (n type), and arsenic (n type).

In some embodiments, the semiconductor substrate 10 has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm. In some embodiments, the high resistivity single crystal semiconductor handle substrate may comprise a p type dopant, such as boron, gallium, aluminum, or indium. In some embodiments, the high resistivity single crystal semiconductor handle substrate may comprise a n type dopant, such as phosphorus, antimony, or arsenic. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The semiconductor substrate 10 may comprise single crystal silicon. The semiconductor substrate 10 may have any of (100), (110), or (111) crystal orientation, and the choice of crystal orientation may be dictated by the end use of the structure. In some preferred embodiments, the semiconductor substrate 10 has (100) crystal orientation since the silicon germanium layer of the present invention is suitable to replace silicon device layers in a logic device. The use of silicon germanium enhances the logic device's switching speed, and the (100) crystal orientation is generally used in CMOS devices, such as logic devices, as this crystal plane provides the best device performance.

With reference to FIG. 1A, the semiconductor substrate 10 comprises a central axis 22. The central axis 22 is specifically delineated in FIG. 1A since the "thickness" of the various layers of the substrate 10 and layers subsequently added according to the method of the present invention are measured along this central axis 22.

II. Germanium Deposition and Anneal

Figure 1B:
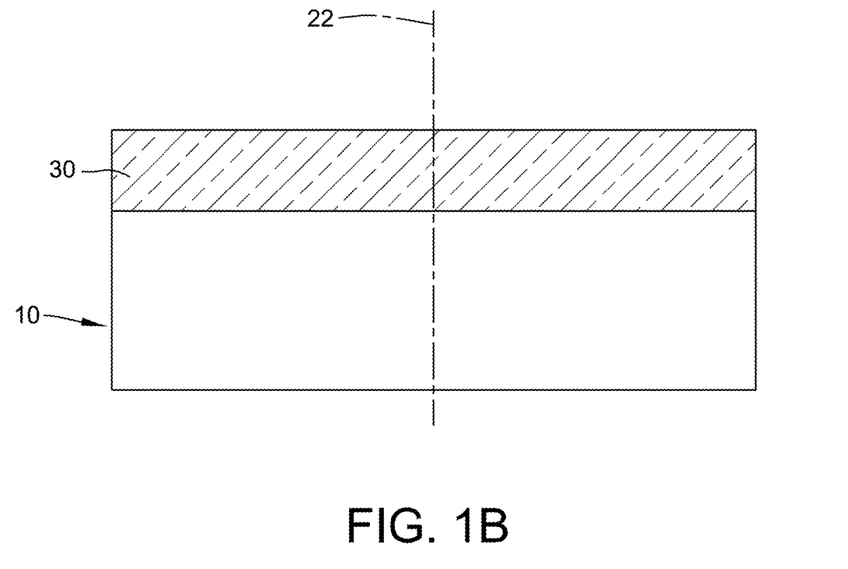

According to the method of the present invention, and with reference to FIG. 1B, a layer 30 comprising germanium is deposited onto the front surface 12 (FIG. 1A) of the semiconductor substrate 10. In some embodiments, the layer 30 comprising germanium is substantially pure Germanium in that the precursors employed to deposit the germanium layer do not include precursors that would substantially deposit other materials, e.g., silicon. Accordingly, the layer 30 comprising germanium may comprise no more than trace amounts of other materials (less than about 1%, preferably less than about 0.1%, less than about 0.01%, or even less than about 0.001%). Stated another way, the layer 30 comprising germanium is at least about 95% Ge, at least about 98% Ge, at least about 99% Ge, at least about 99.99% Ge, or even at least about 99.999% Ge. Germanium may be deposited in a layer 30 having a deposited thickness between about 0.1 micrometer and about 100 micrometers as measured along the central axis 22, such as between about 0.5 micrometer and about 100 micrometers as measured along the central axis 22, such as between about 0.5 micrometer and about 50 micrometers as measured along the central axis 22, or between about 1 micrometer and about 10 micrometers as measured along the central axis 22.

The germanium layer 30 may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Germanium may be deposited in a pulsed or continuous mode. In some embodiments, the germanium may be deposited by epitaxial deposition. Commercially available tools used for Ge deposition includes but not limited to ASM Epsilon E2000, ASM Epsilon E3200, Centura. Germanium may be deposited by epitaxial deposition using germanium precursors such as $GeH_4$, $Ge_2H_4$, $GeCl_4$, $GeCl_2$, $GeF_2$, $GeF_4$, $GeI_2$, $GeI_4$, and combinations thereof. The chamber ambient atmosphere may additionally comprise a carrier gas, which may be inert or it may be a reducing atmosphere. Suitable carrier gases include hydrogen, argon, helium, nitrogen, or any combination thereof. A preferred carrier gas, which is also a reactant, is hydrogen. The germanium layer deposition temperature may be between about 200° C. and about 900° C., such as between about 200° C. and about 800° C., such as between about 300° C. and about 700° C., or between about 400° C. and about 600° C. The chamber ambient pressure may be between about 10 Torr (about 1.33 kPa) and about 760 Torr (about 101.32 kPa), preferably between about 10 Torr (about 1.33 kPa) and about 100 Torr (about 13.33 kPa).

In some embodiments of the present invention, after deposition of the germanium layer, the semiconductor substrate 10 comprising a layer 30 comprising germanium thereon is subjected to an anneal to thereby increase the mobility of threading dislocations and cause their annihilation. Threading dislocations have high mobility in Ge. The anneal increases the probability that the threading dislocations glide through the Ge layer, where they combine with each other or reach the surface, where they are annihilated. See Wang, et. al., APPLIED PHYSICS LETTERS 94, 102115 _2009. Additionally, the high mobility of threading dislocations in Ge prevents the formation of threading dislocation pileups as typically found in SiGe buffer layers. The anneal my reduce the threading dislocation density in the germanium buffer layer to no more than about $1 \times 10^7$ threading dislocations/cm², such as no more than about 1×10⁶ threading dislocations/cm².

In addition, the high mobility of threading dislocations in Ge inhibits or even prevents the formation of threading dislocation pileups, thereby reducing wafer deformation. As there are no dislocation pileups in a Ge buffer layer, the residual stress in a strain relaxed Ge buffer is the stress due to the mismatch of the coefficient of thermal expansion (5.9 ppm for Ge and 2.6 ppm for Si). By contrast, when a SiGe buffer is grown on a Si substrates, the threading dislocations are either piled up or do not glide long enough to annihilate due to its higher glide activation energy (~1.5 eV for Ge and 2.3 eV for SiGe). As result, stress associated with the high density of threading dislocations in combination with the thermal stress leads to large wafer deformation. Increasing Ge concentration in SiGe buffer layer mitigates wafer deformation to some extent.

Moreover, the anneal may reduce surface roughness. The higher surface mobility of Ge atoms leads to improved surface roughness (root mean square, $R_{ms}$, roughness on the order of 0.5 nm) of the buffer layer compared to a SiGe layer (root mean square, $R_{ms}$, roughness on the order of between 1 and 20 nm). The root mean squared as a measure of roughness is calculated by the equation $$R_q = \sqrt{\frac{1}{n}\sum_{i=1}^{n} y_i^2},$$

wherein the roughness profile contains ordered, equally spaced points along the trace, and $y_i$ is the vertical distance from the mean line to the data point. Rms is typically measured over a 2×2 micrometer² area. The smooth Ge buffer layer surface provides an excellent start surface for further growth of Si etch stop layer or SiGe top layer, and no chemical mechanical polishing process is needed as is when SiGe buffer layer is used.

Still further, the germanium buffer layer facilitates the growth of a smooth Si and SiGe top layer. When Si or SiGe top layer is grown on a strain relaxed Ge buffer layer, the lattice mismatch between Si (SiGe) and Ge builds tensile stress in the Si (SiGe) top layer. The tensile stress provides a driving force for surface smoothening during SiGe top layer growth. A smooth SiGe layer can be obtained by this approach, which benefits the subsequent wafer bonding process.

The anneal may occur at a temperature of at least about 500° C., such as at least about 750° C., such as between about 500° C. and about 930° C., or between about 750° C. and about 900° C. The anneal temperature should be lower than germanium's melting point, which is 938.2° C. The chamber ambient pressure may be between about 10 Torr (about 1.33 kPa) and about 760 Torr (about 101.32 kPa), preferably between about 10 Torr (about 1.33 kPa) and about 100 Torr (about 13.33 kPa). The chamber ambient atmosphere during the anneal may comprise a carrier gas, which may be inert or it may be a reducing atmosphere. Suitable gases include hydrogen, helium, nitrogen, argon, or any combination thereof. The anneal duration may be between about 1 second and about 60 minutes, such as between about 10 seconds and about 30 minutes.

III. Deposition of Silicon Etch Stop Layer

Figure 1C:
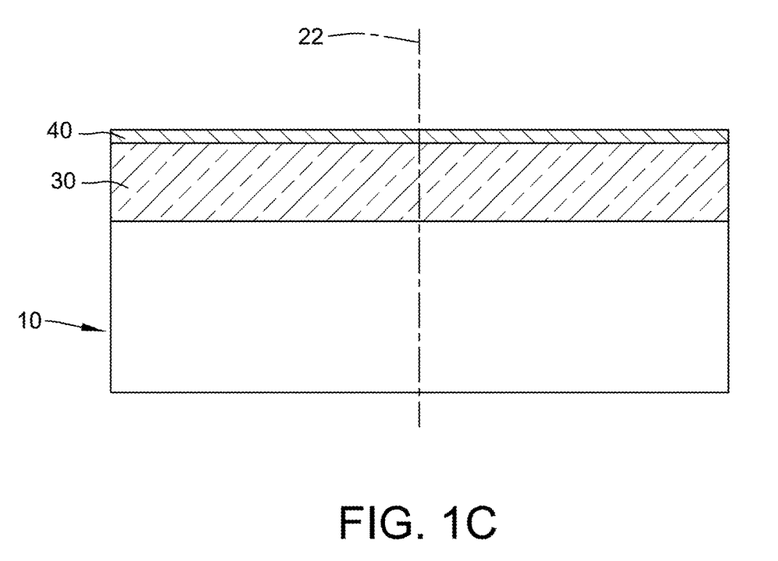

In some embodiments and with reference to FIG. 1C, after deposition of a germanium buffer layer 30, an etch stop layer 40 comprising silicon may be deposited upon the germanium buffer layer 30. The etch stop layer 40 comprising silicon may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). In some embodiments, silicon may be deposited by epitaxial deposition. Silicon precursors include methyl silane, silicon tetrahydride (silane), trisilane ($Si_3H_8$), disilane ($Si_2H_6$), pentasilane, neopentasilane, tetrasilane, dichlorosilane ($SiH_2Cl_2$), trichlorosilane ($SiHCl_3$), silicon tetrachloride ($SiCl_4$), among others. In some preferred embodiments, the silicon precursor is selected from among silane, dichlorosilane ($SiH_2Cl_2$), and trichlorosilane ($SiHCl_3$). The chamber ambient atmosphere may additionally comprise a carrier gas, which may be inert or it may be a reducing atmosphere. Suitable carrier gases include hydrogen, argon, helium, nitrogen, or any combination thereof. A preferred carrier gas, which is also a reactant, is hydrogen. In some embodiments, the deposition temperature may be between about 300° C. and about 800° C., such as between about 300° C. and about 600° C., such as between about 400° C. and about 500° C. The chamber ambient pressure may be between about 10 Torr (about 1.33 kPa) and about 760 Torr (about 101.32 kPa), preferably between about 10 Torr (about 1.33 kPa) and about 100 Torr (about 13.33 kPa).

In some embodiments, the etch stop layer 40 comprising silicon has a thickness between about 0.1 nanometer and about 50 nanometers, as measured along the central axis 22. In some embodiments, the thickness may be between about 0.5 nanometer and about 20 nanometers, as measured along the central axis 22, or between about 0.5 nanometer and about 5 nanometers, as measured along the central axis 22.

The etch stop layer 40 comprising silicon between the Ge or SiGe layer and the Ge buffer layer is advantageous for providing a stopping layer during the SGOI finishing process. Additionally, the etch stop layer 40 comprising silicon provides effective passivation between the SiGe device layer and the underlying insulator layer, typically $SiO_2$, in the final SGOI structure.

IV. Deposition of Ge-Containing Layer (Pure Germanium Layer or Silicon Germanium Layer)

Figure 1D:
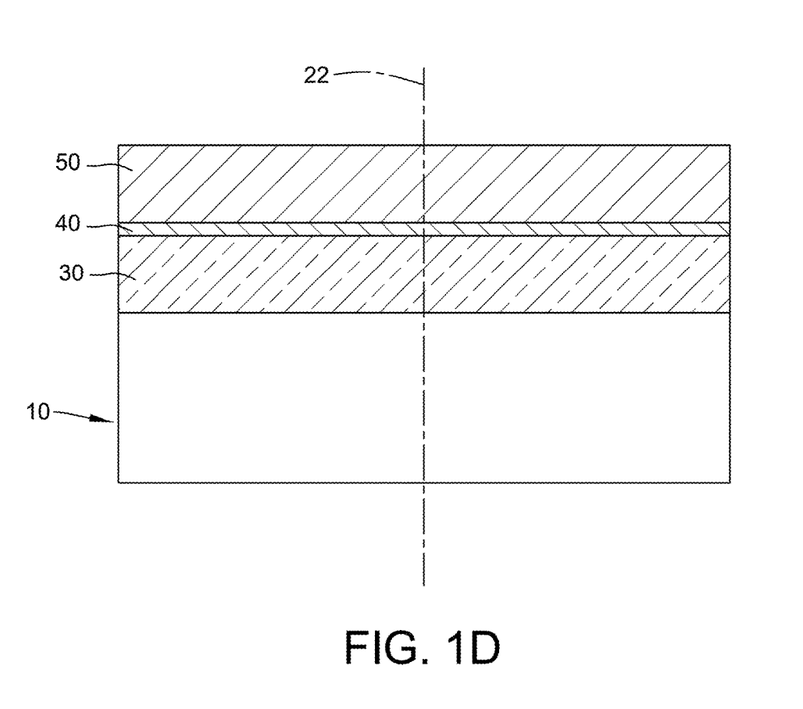

In some embodiments and with reference to FIG. 1D, after the deposition of the germanium buffer layer 30 and the etch stop layer 40 comprising silicon, a layer 50 comprising germanium, optionally with silicon, is deposited upon the etch stop layer 40 comprising silicon. The layer comprising germanium, optionally with silicon, has a formula $Si_xGe_{1-x}$, wherein x is between about 0.00 and about 0.8, molar ratio, such as between about 0.1 and about 0.8, molar ratio, such as between about 0.1 and about 0.4, molar ratio. The layer 50 comprising germanium, optionally with silicon, may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). In some embodiments, silicon and germanium may be deposited by epitaxial deposition. Silicon precursors include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. In some preferred embodiments, the silicon precursor is selected from among silane, dichlorosilane ($SiH_2Cl_2$), and trichlorosilane ($SiHCl_3$). Germanium may be deposited by epitaxial deposition using germanium precursors selected from the group consisting of $GeH_4$, $Ge_2H_4$, $GeCl_4$, and combinations thereof. The chamber ambient atmosphere may additionally comprise a carrier gas, which may be inert or it may be a reducing atmosphere. Suitable carrier gases include hydrogen, argon, helium, nitrogen, or any combination thereof. A preferred carrier gas, which is also a reactant, is hydrogen. The layer 50 comprising germanium, optionally with silicon, may be deposited at a deposition temperature may be between about 200° C. and about 800° C., such as between about 300° C. and about 700° C. The chamber ambient pressure may be between about 10 Torr (about 1.33 kPa) and about 760 Torr (about 101.32 kPa), preferably between about 10 Torr (about 1.33 kPa) and about 100 Torr (about 13.33 kPa).

In some embodiments, the layer 50 comprising germanium, optionally with silicon, has a thickness between about 1 nanometer and about 1000 nanometers, as measured along the central axis 22. In some embodiments, the thickness may be between about 5 nanometers and about 300 nanometers, as measured along the central axis 22. The thickness of the layer 50 comprising germanium, optionally with silicon, dictates the thickness of the Ge or SiGe device layer on the final SGOI structure.

V. Deposition of Additional Layers to Prepare a Layer Stack

Figure 1E:
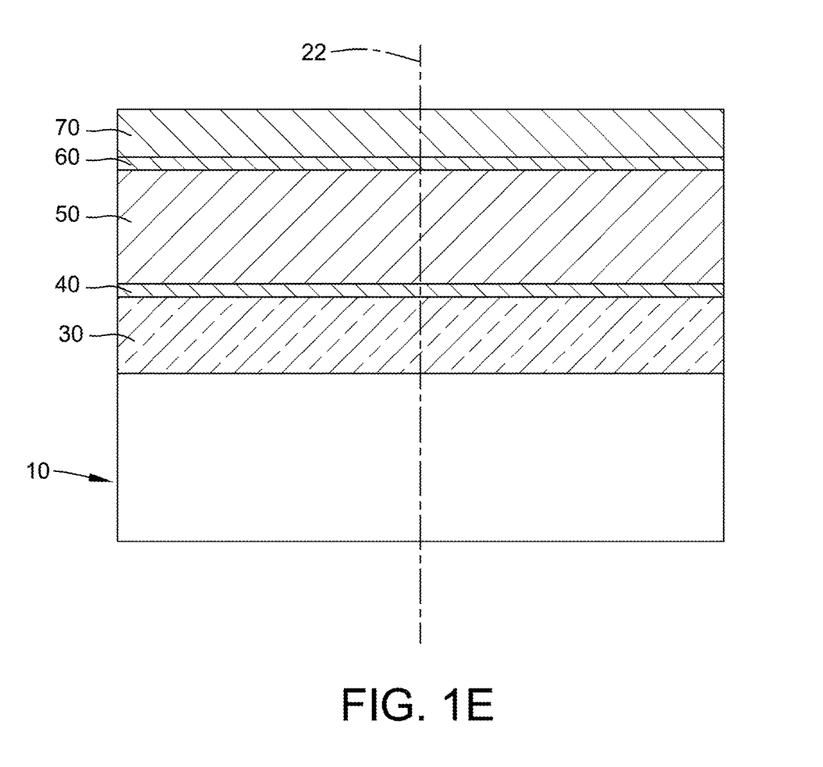

With reference now to FIG. 1E, the steps of deposition of the silicon etch stop layer and the deposition of the layer comprising germanium, optionally with silicon, may be repeated, as disclosed herein, resulting in a multilayer structure comprising two silicon etch layers 40, 60 and two layers 50, 70 comprising germanium, optionally with silicon. The deposition of a pair of a silicon etch stop layer and a layer comprising germanium, optionally with silicon, may be repeated one or more than one time, i.e., twice, thrice, four times, five times, six times, or more, to thereby prepare a multilayer structure comprising multiple pairs of a silicon etch layer and a layer comprising silicon and germanium.

V. Layer Transfer and Manufacture of Semiconductor-On-Insulator Structures (GeOI or SGOI Structures)

Figure 2:
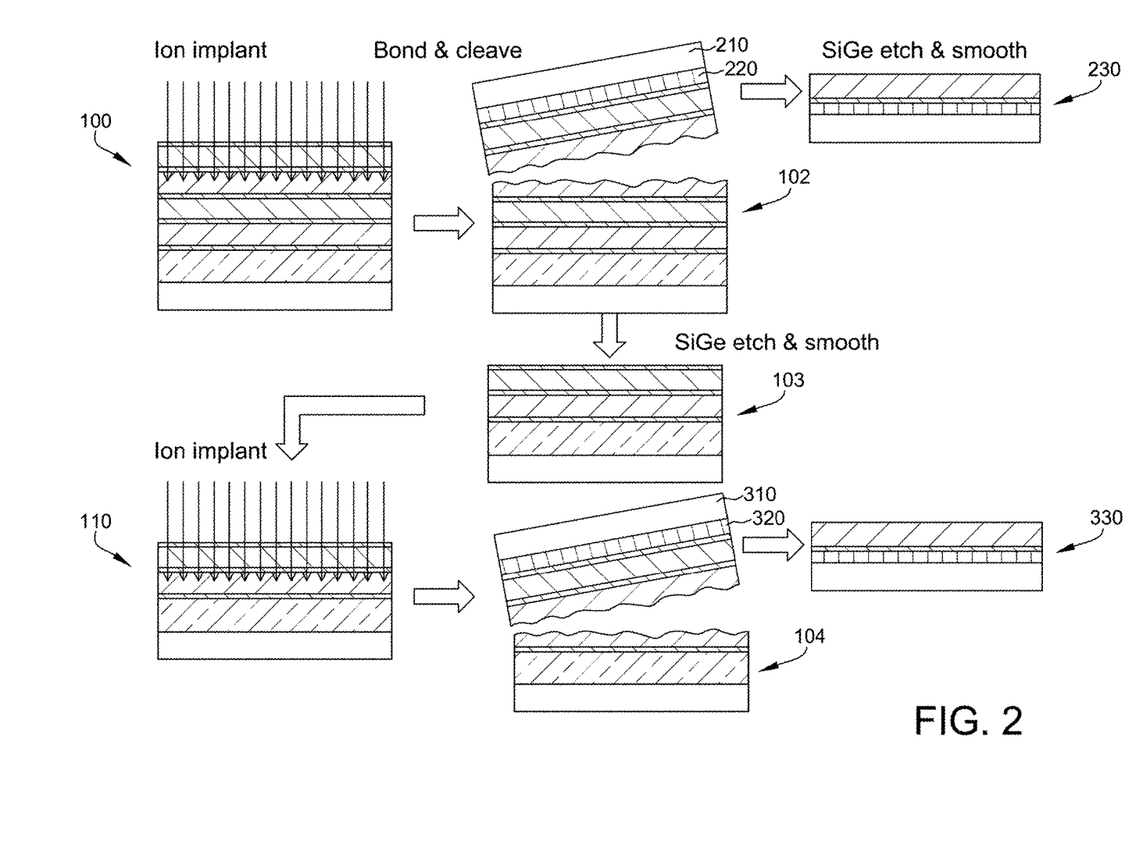
FIG. 2 depicts an exemplary process flow to manufacture a Silicon Germanium-on-Insulator (SGOI) structure according to some embodiments of the method of the present invention.

With reference to FIG. 2, the multilayer structure (labeled as 100 and 110 in FIG. 2) comprising at least one pair of a silicon etch stop layer and a layer comprising germanium, and optionally silicon, is a donor structure in the manufacture of a semiconductor-on-insulator 230, 330, such as a germanium-on-insulator (GeOI) or a silicon germanium-on-insulator (SGOI) structure. As depicted in FIG. 2, the multilayer donor structure 100 begins the process of layer transfer with four pairs of a silicon etch layer and a layer comprising germanium, optionally with silicon. The multilayer donor structure may comprise one or more, e.g., at least two, three, four, five, six, seven, or more pairs of a silicon etch stop layer and a layer comprising germanium, optionally with silicon. After a first layer transfer operation, the multilayer donor structure 102 comprising a rough cleave surface is subject to wet chemical etch to remove the rough layer comprising germanium, and optionally silicon, and becomes structure 103. The etchant used only etches the layer comprising germanium, and optionally silicon, selectively but does not etch the silicon etch stop layer. A suitable etchant solution is an $H_2O_2$ solution (comprising between 0.1 and 1 mole hydrogen peroxide per liter of distilled water). The etch operation can be done in a standard semiconductor fabrication cleaner at room temperature or elevated temperature (e.g., between 50 and 70° C.). Depending on the etchant concentration and temperature, the typical etch time ranges from 30 seconds to 10 minutes. A layer pair comprising the etch stop layer 40 comprising silicon and the layer 50 comprising germanium, optionally with silicon from the starting multilayer donor structure 100 may be transferred onto a handle substrate comprising a semiconductor handle layer 210 and a dielectric layer 220. The process may be repeated, one or more times, in which a layer pair from the multilayer donor structure 110 may be transferred onto a handle substrate comprising a semiconductor handle layer 310 and a dielectric layer 320. After a second layer transfer operation, the resultant multilayer donor structure 104 is subject to another wet chemical etch to remove the to remove the rough layer comprising germanium, and optionally silicon, having the rough cleave surface. Layer transfer results in the manufacture of semiconductor-on-insulator 230, 330, such as a germanium-on-insulator (GeOI) or a silicon germanium-on-insulator (SGOI) structure.

According to some embodiments of the present invention, ions are implanted into the multilayer structure 100 through a layer pair comprising a silicon etch stop layer and a layer comprising germanium, optionally with silicon in the first step toward preparing a cleave plane near a silicon etch layer. The ions are implanted to a depth sufficient so that at least one layer pair comprising a silicon etch layer and a layer comprising silicon and germanium may be transferred onto a handle substrate. Before ion implantation, the front surface of the multilayer structure may be thermally oxidized (in which some portion of the deposited semiconductor material film will be consumed) to prepare the semiconductor oxide film, or the semiconductor oxide (e.g., silicon dioxide) film may be grown by CVD oxide deposition, such as PECVD or LPCVD. In some embodiments, the front surface of the multilayer structure may be thermally oxidized in a furnace such as an ASM A400 in the same manner described above. In some embodiments, the donor substrates are oxidized to provide an oxide layer on the front surface layer of at least about 5 nanometer thick, such as between about 5 nanometers and about 1000 nanometers thick, or at least about 10 nanometer thick, such as between about 10 nanometers and about 10,000 nanometers, between about 10 nanometers and about 5,000 nanometers, or between about 100 nanometers and about 800 nanometers, such as about 600 nanometers.

Additionally, the oxide layer on the front surface of the multilayer structure may be subjected to chemical mechanical polishing (CMP) to reduce the surface roughness, preferably to the level of $RMS_{2\times 2\ micrometer}^2$ that is less than about 5 angstroms, wherein root mean squared $$R_q = \sqrt{\frac{1}{n}\sum_{i=1}^{n} y_i^2},$$

the roughness profile contains ordered, equally spaced points along the trace, and $y_i$ is the vertical distance from the mean line to the data point.

Ion implantation may be carried out in a commercially available instrument, such as an Applied Materials Quantum II, a Quantum LEAP, or a Quantum X. Implanted ions include He, H, $H_2$, or combinations thereof. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$, such as from about $10^{15}$ ions/cm$^2$ to about $10^{16}$ ions/cm$^2$. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth of implantation determines amount of material transferred onto a handle substrate. Preferably, the ion implantation depth is, as depicted in FIG. 2 sufficient to form a cleave plane in a layer of silicon germanium so that the material transferred onto the handle substrate comprises a silicon etch stop layer, a silicon germanium layer, and another silicon etch stop layer. The insertion of Si etch stop layer also leads to a sharp cleave plane and results in reduce surface roughness of the cleave surface. The interfacial strain induced by the silicon etch stop layer at the interface between two adjacent layers comprising germanium, optionally with silicon, tends to trap implanted ions, such as H+ or He+, which confines the cavities at the silicon etch stop layer. Cleave is likely to happen along the silicon etch stop layer.

In some embodiments of the present invention, the multilayer structure having an ion implant region therein formed by helium ion and/or hydrogen ion implant is annealed at a temperature sufficient to form a thermally activated cleave plane. An example of a suitable tool might be a simple Box furnace, such as a Blue M model. In some preferred embodiments, the structure is annealed at a temperature of from about 200° C. to about 350° C., from about 225° C. to about 325° C., preferably about 300° C. Thermal annealing may occur for a duration of from about 10 minutes to about 10 hours, such as from about 0.5 hours to about 4 hours, or from about 2 hours to about 8 hours. Thermal annealing within these temperatures ranges is sufficient to form a thermally activated cleave plane.

According to the method of the present invention, the multilayer structure is bonded to a handle substrate 210. The handle substrate 210 preferably comprises a dielectric layer 220 in interfacial contact with a front surface thereof. The top silicon layer of the multilayer structure is bonded to the dielectric layer 220 in interfacial contact with the front surface of the handle substrate 210. The handle substrate 210 comprises a semiconductor material selected from the group consisting of silicon, silicon carbide, silicon germanium, gallium arsenide, gallium nitride, indium phosphide, indium gallium arsenide, germanium, and combinations thereof. The semiconductor handle substrate 210 comprises two major, generally parallel surfaces, one of which is the front surface of the semiconductor handle wafer and the other of which is a back surface of the semiconductor handle substrate, a circumferential edge joining the front and back surfaces of the semiconductor handle substrate, and a bulk region between the front and back surfaces of the semiconductor handle substrate The semiconductor handle substrate 210 is typically a wafer having a nominal diameter of at least about 150 mm, at least about 200 mm, at least about 300 mm, or at least about 450 mm. The handle substrate 210 thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the handle substrate 210 comprises single crystal silicon, which has been sliced from a single crystal ingot grown in accordance with conventional Czochralski crystal growing methods or float zone growing methods.

The handle substrate comprises a dielectric layer 220. Suitable dielectric layers may comprise a material selected from among silicon dioxide, silicon nitride, silicon oxynitride, hafnium oxide, titanium oxide, zirconium oxide, lanthanum oxide, barium oxide, and a combination thereof. In some embodiments, the dielectric layer has a thickness of at least about 5 nanometer thick, at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers, or between about 100 nanometers and about 800 nanometers, such as about 600 nanometers.

In some embodiments, the dielectric layer comprises one or more insulating material selected from the group consisting of silicon dioxide, silicon nitride, silicon oxynitride, and any combination thereof. In some embodiments, the dielectric layer has a thickness of at least about 5 nanometer thick, at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers, or between about 100 nanometers and about 800 nanometers, such as about 600 nanometers.

In some embodiments, the dielectric layer comprises multiple layers of insulating material. The dielectric layer may comprise two insulating layers, three insulating layers, or more. Each insulating layer may comprise a material selected from among silicon dioxide, silicon oxynitride, silicon nitride, hafnium oxide, titanium oxide, zirconium oxide, lanthanum oxide, barium oxide, and any combination thereof. In some embodiments, each insulating layer may comprise a material selected from the group consisting of silicon dioxide, silicon nitride, siliconoxynitride, and any combination thereof. Each insulating layer may have a thickness of at least about 5 nanometer thick, at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers, or between about 100 nanometers and about 800 nanometers, such as about 600 nanometers.

Since the mechanical bond between the top silicon layer of the multilayer structure and the dielectric layer 220 of the handle substrate is relatively weak, in some embodiments, the bonded structure may be further annealed to solidify the bond. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 350° C., from about 225° C. to about 325° C., preferably about 300° C. Thermal annealing may occur for a duration of from about 10 minutes to about 10 hour, preferably a duration of about 2 hours. Thermal annealing within these temperatures ranges is sufficient to form a thermally activated cleave plane. After the thermal anneal to activate the cleave plane, the bonded structure may be cleaved.

After the thermal anneal, the bond between the top silicon layer of the multilayer structure and the dielectric layer 220 of the handle substrate is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a semiconductor device layer, preferably a silicon device layer, on the semiconductor-on-insulator composite structure.

After cleaving, the cleaved structure may be subjected to an optional high temperature anneal in order to further strengthen the bond between the transferred layer (comprising the top silicon layer, the layer comprising silicon and germanium, and an etch stop layer comprising silicon) and the semiconductor handle substrate. An example of a suitable tool might be a vertical furnace, such as an ASM A400. In some preferred embodiments, the bonded structure is annealed at a temperature of from about 800° C. to about 900° C., preferably at about 850° C. The temperature of the anneal should be lower than the melting point of Ge, which is 938.2° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

After the cleave and high temperature anneal, the bonded structure may be subjected to an etching process designed to remove excess material, including silicon germanium. The layer comprising germanium, optionally with silicon, can be etched in a solution. The etchant only etches the layer 50 comprising germanium, optionally with silicon, selectively but does not etch the Si etch stop layer. A suitable etchant solution is an $H_2O_2$ solution (comprising between 0.1 and 1 mole hydrogen peroxide per liter of distilled water). The etch operation can be done in a standard semiconductor fabrication cleaner at room temperature or elevated temperature (e. g., between 50 and 70° C.). Depending on the etchant concentration and temperature, the typical etch time ranges from 30 seconds to 10 minutes. HCl may be added to the $H_2O_2$-containing etchant to help remove metal contamination.

In some embodiments, the bonded structure may be etched by subjecting to a vapor phase HCl etch process in a horizontal flow single wafer epitaxial reactor using $H_2$ as a carrier gas. The silicon germanium-on-insulator (SGOI) structure 230 comprises a handle substrate 210, a dielectric layer 220, a thin silicon layer, and a layer comprising germanium, optionally with silicon.

Since the multilayer structure (exemplarily depicted in FIG. 1E) and shown as 110 in FIG. 2 still comprises additional pairs of a silicon etch stop layer and a layer comprising germanium, optionally with silicon, the process of ion implantation, bonding, cleaving, and etching, to thereby prepare an additional semiconductor-on-insulator 330, such as a germanium-on-insulator (GeOI) or a silicon germanium-on-insulator (SGOI) structure, comprising a handle substrate 310, a dielectric layer 320, a thin silicon layer, and a layer comprising germanium, optionally with silicon. The process may continue until the additional pairs of a silicon etch layer and a layer comprising germanium, optionally with silicon are exhausted. Alternatively, the donor structure may be subjected to additional cycles of deposition of pairs of a silicon etch layer and a layer comprising silicon and germanium.

Having described the invention in detail, it will be apparent that modifications and variations are possible without departing from the scope of the invention defined in the appended claims.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

What is claimed is:

1. A method of preparing a multilayer structure, the method comprising:
    (a) depositing a first layer comprising germanium on a front surface of a silicon substrate, wherein the silicon substrate comprises two major, generally parallel surfaces, one of which is the front surface of the silicon substrate and the other of which is a back surface of the silicon substrate, a circumferential edge joining the front and back surfaces of the silicon substrate, a central plane between and parallel to the front surface and the back surface of the silicon substrate, a central axis perpendicular to the central plane, and a bulk region between the front and back surfaces of the silicon substrate, and further wherein the first layer comprising germanium has a thickness between about 0.5 micrometer and about 100 micrometers, as measured along the central axis;
    (b) depositing a second layer comprising silicon on the first layer comprising germanium, wherein the second layer comprising silicon has a thickness between about 0.5 nanometer and about 5 nanometers, as measured along the central axis; and
    (c) depositing a third layer comprising germanium and optionally silicon on the second layer comprising silicon, wherein the third layer comprising silicon and germanium has a formula $Si_xGe_{1-x}$, wherein x is between about 0 and about 0.8, molar ratio and further wherein the third layer comprising silicon and germanium has a thickness of at least about 1 nanometer; and
    repeating steps (b) and (c) to thereby prepare the multilayer structure comprising the silicon substrate, the first layer comprising germanium in interfacial contact with the front surface of the silicon substrate, and two pairs of the second layer comprising silicon and the third layer comprising germanium and optionally silicon.

2. The method of claim 1 wherein steps (b) and (c) are repeated at least three times to thereby prepare a multilayer structure comprising the silicon substrate, the first layer comprising germanium in interfacial contact with the front surface of the silicon substrate, and four pairs of the second layer comprising silicon and the third layer comprising germanium and optionally silicon.

3. The method of claim 1 wherein steps (b) and (c) are repeated at least twice to thereby prepare a multilayer structure comprising the silicon substrate, the first layer comprising germanium in interfacial contact with the front surface of the silicon substrate, and three pairs of the second layer comprising silicon and the third layer comprising germanium and optionally silicon.

4. The method of claim 1 wherein the first layer comprising germanium has a thickness between about 0.5 micrometer and about 50 micrometers, as measured along the central axis.

5. The method of claim 1 wherein the first layer comprising germanium has a thickness between about 1 micrometer and about 10 micrometers, as measured along the central axis.

6. The method of claim 1 further comprising annealing the silicon substrate comprising the first layer comprising germanium before depositing the second layer comprising silicon at a temperature between about 500° C. and about 930° C. and duration between 1 second and about 60 minutes to reduce the quantity of threading dislocations, to strain relax the first layer comprising germanium, and to reduce surface roughness.

7. The method of claim 1 wherein the second layer comprising silicon has a thickness between about 0.5 nanometer and about 20 nanometers, as measured along the central axis.

8. The method of claim 1 wherein the third layer comprises germanium and silicon, and has a formula $Si_xGe_{1-x}$, wherein x is between about 0.1 and about 0.4, molar ratio.

9. The method of claim 1 wherein the third layer comprising germanium and optionally silicon has a thickness between about 1 nanometer and about 1000 nanometers.

10. The method of claim 1 wherein the third layer comprising germanium and optionally silicon has a thickness between about 5 nanometers and about 300 nanometers.

11. The method of claim 1 wherein each of the layers is deposited by epitaxial deposition.

12. The method of claim 6 wherein the threading dislocation density is no more than about $1 \times 10^7$ threading dislocations/cm$^2$.

13. The method of claim 6 wherein the threading dislocation density is no more than about $1 \times 10^6$ threading dislocations/cm$^2$.

14. A method of preparing a semiconductor-on-insulator structure, the method comprising:
forming a cleave plane in a multilayer structure, the multilayer structure comprising (i) a silicon substrate comprising two major, generally parallel surfaces, one of which is a front surface of the silicon substrate and the other of which is a back surface of the silicon substrate, a circumferential edge joining the front and back surfaces of the silicon substrate, a central plane between and parallel to the front surface and the back surface of the silicon substrate, a central axis perpendicular to the central plane, and a bulk region between the front and back surfaces of the silicon substrate, (ii) a germanium layer in interfacial contact with the front surface of the silicon substrate, (iii) at least two pairs of layers in interfacial contact with the germanium layer, each pair of layers comprising a silicon layer and a layer comprising germanium and optionally silicon having a formula $Si_xGe_{1-x}$, wherein x is between about 0 and about 0.8, molar ratio, and (iv) a silicon passivation layer in contact with the at least one pair of layers, wherein the cleave plane is formed within the at least one pair of layers comprising the silicon layer and the silicon germanium layer; and
bonding the multilayer structure to a dielectric layer interfacial contact with a front surface of a semiconductor handle substrate, the semiconductor handle substrate comprising two major, generally parallel surfaces, one of which is the front surface of the semiconductor handle wafer and the other of which is a back surface of the semiconductor handle substrate, a circumferential edge joining the front and back surfaces of the semiconductor handle substrate, and a bulk region between the front and back surfaces of the semiconductor handle substrate.

15. The method of claim 14 wherein the multilayer structure comprises at least three pairs of layers comprising the silicon layer and the layer comprising germanium and optionally silicon.

16. The method of claim 14 wherein the cleave plane is formed by:
implanting ions into the multilayer structure, wherein the ions are implanted through the silicon passivation layer to a depth of peak implanted ion concentration within the at least two pairs of layers comprising the silicon layer and the layer comprising germanium and optionally silicon; and
annealing the multilayer structure at a temperature and for a duration sufficient to form the cleave plane at or near the depth of peak implanted ion concentration.

17. The method of claim 14 wherein the germanium layer has a thickness between about 0.5 micrometer and about 100 micrometers, as measured along the central axis.

18. The method of claim 14 wherein the silicon layer has a thickness between about 0.5 nanometer and about 5 nanometers, as measured along the central axis.

19. The method of claim 14 wherein the layer comprising germanium and optionally silicon has a formula $Si_xGe_{1-x}$, wherein x is between about 0.1 and about 0.4, molar ratio.

20. The method of claim 14 wherein the layer comprising germanium and optionally silicon has a thickness between about 1 nanometer and about 1000 nanometers.

21. The method of claim 14 further comprising cleaving the multilayer structure at the cleave plane within the at least two pairs of layers comprising the silicon layer and the layer comprising germanium and optionally silicon, to thereby prepare a semiconductor-on-insulator structure comprising the semiconductor handle substrate, the dielectric layer, the silicon passivation layer, and at least a portion of the at least two pairs of layers comprising the silicon layer and the layer comprising germanium and optionally silicon.

22. The method of claim 16 wherein the implanted ions are selected from the group consisting of hydrogen, helium, and a combination thereof.

23. The method of claim 21 further comprising etching and smoothing the cleaved portion of the pair of layers comprising the silicon layer and the layer comprising germanium and optionally silicon.

24. A multilayer structure comprising:
(i) a silicon substrate comprising two major, generally parallel surfaces, one of which is a front surface of the silicon substrate and the other of which is a back surface of the silicon substrate, a circumferential edge joining the front and back surfaces of the silicon substrate, a central plane between and parallel to the front surface and the back surface of the silicon substrate, a central axis perpendicular to the central plane, and a bulk region between the front and back surfaces of the silicon substrate,
(ii) a germanium layer in interfacial contact with the front surface of the silicon substrate having a thickness between about 0.5 micrometer and about 100 micrometers, as measured along the central axis,
(iii) at least two pairs of layers in interfacial contact with the germanium layer, each pair of layers comprising a silicon layer and a layer comprising germanium and optionally silicon having a formula $Si_xGe_{1-x}$, wherein x is between about 0 and about 0.8, molar ratio, and
(iv) a silicon passivation layer in contact with the at least two pairs of layers.

25. The multilayer structure of claim 24 comprising at least two three pairs of layers comprising the silicon layer and the layer comprising germanium and optionally silicon.

26. The multilayer structure of claim 24 wherein the germanium layer has a thickness between about 0.5 micrometer and about 50 micrometers, as measured along the central axis.

27. The multilayer structure of claim 24 wherein the germanium layer has a thickness between about 1 micrometer and about 10 micrometers, as measured along the central axis.

28. The multilayer structure of claim 24 wherein the germanium layer has a threading dislocation density of no more than about $1 \times 10^7$ threading dislocations/cm$^2$.

29. The multilayer structure of claim 24 wherein the germanium layer has a threading dislocation density of no more than about $1 \times 10^6$ threading dislocations/cm$^2$.

30. The multilayer structure of claim 24 wherein the silicon layer of the at least one pair of layers has a thickness between about 0.5 nanometer and about 5 nanometers, as measured along the central axis.

31. The multilayer structure of claim 24 wherein the layer comprising germanium and silicon has a formula $Si_xGe_{1-x}$, wherein x is between about 0.1 and about 0.4, molar ratio.

32. The multilayer structure of claim 24 wherein the layer comprising germanium and optionally silicon has a thickness between about 1 nanometer and about 1000 nanometers.

33. The multilayer structure of claim 24 wherein the layer comprising germanium and optionally silicon has a thickness between about 5 nanometers and about 300 nanometers.

\* \* \* \* \*